United States Patent [19]

Murakami et al.

[11] Patent Number: 4,887,052
[45] Date of Patent: Dec. 12, 1989

[54] TUNED OSCILLATOR UTILIZING THIN FILM FERROMAGNETIC RESONATOR

[75] Inventors: Yoshikazu Murakami; Yasuyuki Mizunuma; Takahiro Ohgihara, all of Kanagawa; Hiroyuki Nakano, Tokyo; Kanako Niikura; Tsutomu Okamoto, both of Kanagawa, all of Japan

[73] Assignee: Sony Corporation, Tokyo, Japan

[21] Appl. No.: 276,146

[22] Filed: Nov. 25, 1988

[30] Foreign Application Priority Data

Nov. 27, 1987 [JP] Japan .................. 62-299383
Nov. 27, 1987 [JP] Japan .................. 62-299384

[51] Int. Cl.$^4$ .................. H03B 5/04; H03B 5/18; H03L 1/02; H03L 7/16
[52] U.S. Cl. .................. 331/96; 331/34; 331/117 D; 331/176; 331/177 R; 375/120; 455/264
[58] Field of Search .................. 331/34, 96, 107 DP, 331/117 D, 176, 177; 375/120; 455/258, 260, 264

[56] References Cited

U.S. PATENT DOCUMENTS

| 4,626,800 | 12/1986 | Murakami et al. | .................. 331/96 |
| 4,704,739 | 11/1987 | Murakami et al. | ......... 331/117 D X |
| 4,745,380 | 5/1988 | Murakami et al. | ............. 333/235 X |
| 4,746,884 | 5/1988 | Murakami et al. | ............. 333/235 X |

*Primary Examiner*—David Mis
*Attorney, Agent, or Firm*—Hill, Van Santen, Steadman & Simpson

[57] ABSTRACT

A tuned oscillator utilizing a thin film ferromagnetic resonator is disclosed. The oscillator comprises an active element for oscillator and a YIG thin film resonator connected to the active element as a part of feed-back circuit for the active element. The YIG thin film resonator is applied with a bias magnetic field perpendicular to a surface of a YIG disk which is generated by a permanent magnet for a fixed component and a coil for a variable component for the resonance frequency. The resonance frequency is stabilized by use of a PLL circuit connected to an output of the oscillator and feeding back to the coil. Since the YIG thin film tuned oscillator has a high Q value, high quality communication signal processing can be achieved. The YIG tuned oscillator is used as local oscillator for a transciever.

4 Claims, 9 Drawing Sheets

TUNED OSCILLATOR UTILIZING THIN FILM FERROMAGNETIC RESONATOR

BACKGROUND OF THE INVENTION

The present invention relates to a tuned oscillator utilizing a thin film ferromagnetic resonator and a microwave communication apparatus which uses the tuned oscillator.

Conventional local oscillators used in the RF stage of microwave communication equipment include oscillators which use dielectric resonators (DRO) and voltage controlled oscillators (VCO). The DRO, owing to a high Q value of the dielectric resonator, produces low phase noise, which allows data communication equipment to operate at a low bit error rate (BER) and video signal communication equipment to operate at a large S/N ratio.

Since it is a fixed oscillator, the DRO bases its operation on block conversion, in which signals in the communication band are converted in batchs into the intermediate frequency (IF) and a necessary signal is selected with the VCO in the IF stage, and which causes a problem because an intricate IF stage which includes a tracking filter for blocking the Image signal is required. In case of using a VCO as a local oscillator, signals can be selected in the RF stage, which simplifies the IF stage, but due to a low Q value of the varactor diode which is used as an oscillation active element the phase noise characteristics are inferior, which causes in a deteriorated BER characteristics for data communication and deteriorated S/N ratio for video signal communication.

Recently, there has been proposed a tuning oscillator which utilizes the ferrimagnetic resonance of a yttrium iron garnet (YIG) sphere which is a ferrimagnetic material (Japanese Patent Publicatin No. 53-32671). This YIG-tuned oscillator (YTO) has a high Q value for the YIG resonator and produces low phase noise and its use of magnetic resonance provides a satisfactory linear tuning characteristics, which are advantages for both DRO and VCO devices.

Preceding publications pertinent to the present invention include U.S. Pat. No. 4,626,800 which describes a tuned oscillator which uses an YIG thin film magnetic resonator, and U.S. Pat. Nos. 4,745,380 and 4,746,884 for the technique of compensating the temperature dependency of a ferrimagnetic resonance frequency of the thin film YIG resonator by replacing part of the iron ion ($Fe^{3+}$) of the YIG thin film with a non-magnetic ion.

However, the conventional YTO which uses the above-mentioned YIG sphere has been difficult to use as a local oscillator for communication equipment for the following reasons. Primarly, the d.c. magnetic field which is applied to the YIG sphere depends on the intended oscillation frequency which is generated entirely by feeding current to the coil, which not only results in a large current consumption in the coil, but a large inductance of the coil due to its large number of turns which slows the turning and requires larger dimensions for the oscillator. Secondarily, the difficulty in making YIG sphere results in YTOs with YIG spheres to be unfavorable for mass production and also expensive, and accordingly it is undesirable for the communication equipment in which mass-production and low cost are required.

OBJECT AND SUMMARY OF THE INVENTION

Accordingly, it is an object of this invention to provide a tuned oscillator which has a rapid response for frequency tuning.

Another object of the invention is to provide a tuned oscillator which has low power consumption.

Still another object of this invention is to provide a compact tuned oscillator.

Still another object of this invention is to provide a tuned oscillator which is suitable for mass production and is inexpensive.

Still another object of this invention is to provide a tuned oscillator which has a simple in circuit arrangement for channel selection.

It is further object of this invention to provide a communication equipment which enables high quality communications.

Still further object of the invention is to provide a communication equipment which has a simple intermediate frequency stage.

The inventive tuned oscillator has an active element for oscillation. A ferrimagnetic thin film resonance element is connected in the feedback path of the active element, and a d.c. magnetic field application means including a permanent magnet is used to apply a d.c. magnetic field to the ferrimagnetic thin film resonance element and for producing a fixed magnetic field component. A coil for producing a variable magnetic field component, with the coil supplying feedback in a PLL. The arrangment speeds up the response of tuning, reduces the size of the tuned oscillator, and simplifies the channel selection circuit.

DESCRIPTION OF THE PREFERRED EMBODIMENT

This invention is in a tuned oscillator which comprises an active element 9 (e.g., GaAs FET 1). A ferrimagnetic thin film resonator (e.g., YIG thin film resonator 2) is connected in the feedback path of the active element. A d.c. magnetic field application means includes a permanent magnet which is used for applying a d.c. magnetic field to the ferrimagnetic thin film resonator and for producing a fixed magnetic field component. A coil for producing a variable magnetic field component (e.g., permanent magnet 4c and main coil 4b), are provided with the coil providing feedback in a PHL.

A preferable form of this invention is an YIG thin film resonator for the ferrimagnetic thin film resonator, with the iron ions of the YIG thin film being replaced with nonmagnetic ions so as to compensate the thermal characteristics of the permanent magnet and the oscillating active element.

According to the above-mentioned means, partof the magnetic field necessary for frequency tuning is provided by the permanent magnet, and the coil can have a reduced number of turns in proportion to the fixed magnetic field produced by the permanent magnet. The coil has its inductance accordingly reduced, and consequently the response of the frequency tuning is enhanced. The reduced number of the turns of coil results in a compact turned oscillator. A reduced coil current which results from the fixed magnetic field provided by the permanent magnet produces a tuned oscillator of low power consumption. The ferrimagnetic thin film resonator is readily manufactured with a thin film forming technology and MIC (Microwave Integrated Circuit), which results in the tuned oscillator being suited for large scale production, and makes it inexpensive. The feedback to the coil using a PLL simplifies the circuit arrangement for channel selection.

The YIG thin film tuned oscillator can be used in a communication equipment as the local oscillator for converting IF to the communication frequency.

The YIG thin film tuned oscillator (will be termed "thin film YTO" hereinafter) enables the direct signal selection in the RF stage, and the IF stage can be simplified. Because the YIG thin film tuning oscillator uses a thin film YIG resonator of high Q it has low phase noise and performs high quality communication. For example, low BER in data communication and high S/N ratio in video signal communication are possible.

The present invention will be described in the following oder of the items.

a. YIG thin film tuning oscillator.

b. Compensation of the thermal characteritics of the permanent magnet and the active element.

c. Microwave communication equipment using the thin film YTO as a local oscillator.

d. Microwave transceiver for satellite communication.

a. Thin film YTO

Figure 1:
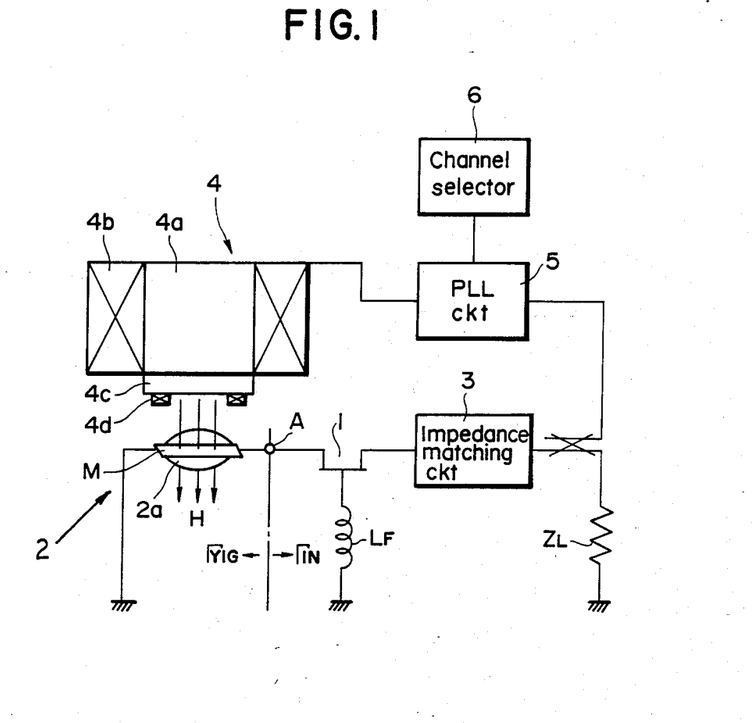
FIG. 1 is a block diagram showing the thin film YTO embodying the present invention.

FIG. 1 is a block diagram showing the thin fil YTO embodying the present invention. As shown in FIG. 1, the thin film YTO of this embodiment consists mainly of a GaAs FET 1 as an active element for oscillation, an YIG thin film resonator 2 as a feedback element, an impedance matching circuit 3, a d.c. magnetic field application means 4 for applying a d.c. magnetic field to the YIG thin film resonator 2, and a PLL (Phase Locked LOOP) circuit 5. A load impedance connected at the output of the thin film YTO is indicated by $Z_L$.

The condition of steady-state oscillation of this thin film YTO is expressed in terms of the reflective YIG seen from terminal A to the $\Gamma_{YIG}$ thin film resonator 2 and the reflectivity $\Gamma_{IN}$ seen from terminal A to the GaAs FET 1 as an active element, as follows.

$$\Gamma_{YIG} \cdot \Gamma_{IN} = 1$$

The YIG thin film resonator 2 has the structure similar to that described in detail in U.S. Pat. No. 4,626,800, and it comprises a ferrimagnetic YIG thin film disk 2a formed on one main surface of a nonmagnetic GGG (gadorinium gallium garnet) substrate, for example, by liquid phase epitaxial growth and a microstrip line. Actually, the YIG thin film resonator 2 is formed together with the GaAs FET 1 on one surface of a dielectric substrate such as alumina. The YIG thin film disk is placed on a microstrip line formed on the surface of the dielectric substrate, while on another surface of the dielectric substrate there is formed a ground conductor. Symbol M indicates the microstrip line. The YIG thin film resonator 2 can readily be fabricated by the thin film forming technology such as liquid phase epitaxy (LPE) and MIC technology, and therefore a tuned oscillator which is suitable for mass production and inexpensive can be obtained. Owing to a high Q value of the YIG thin film resonator 2, the thin film YTO of this embodiment has low phase noise, and the use of ferromagnetic resonance provides the thin film YTO with a satisfactory linear tuning characteristics. Accordingly, by using the thin film YTO as a local oscillator for communication equipment, high quality communication is made possible.

The above-mentioned GaAs FET 1 has its source connected to the microstrip line M and its drain is connected to the impedance matching circuit 3. The gate of the GaAs FET I is grounded through a feedback reactance LF. Namely, the thin film YTO of this embodiment is a tuned oscillator of the common gate, series feedback type.

The d.c. magnetic field application means 4 is made up of a main coil 4b wound on a pole piece 4a which constitutes part of the yoke of the magnetic circuit, and a permanent magnet 4c made of $Nd_2Fe_{14}B$, $CeCo_5$, $SmCo_5$, etc. The fixed magnetic field produced by the permanent magnet 4c and the variable magnetic field produced by the main coil 4b are merged to form a d.c. magnetic field H which are applied to the YIG thin film resonator 2 perpendicularly to the surface of the YIG thin film disk. The YIG thin film resonator 2 is inserted in the gap of the magnetic circuit. The d.c. magnetic field H can be controlled in magnitude to allow frequency tuning by varying the current flowing in the main coil 4b. In the magnetic field H needed for frequency tuning, a fixed component is derived from the fixed magnetic field of the permanent magnet 4c and a variable component is derived from the variable magnetic field of the main coil 4b. For example although satellite communication and ground communication using microwave have different bands depending on each system, the communication band width is about 500 MHz per system, and if the thin film YTO has a lower limit of a tuning range of 13 GHz, for example, the tuning range becomes 13 GHz to 13.5 GHz, and therefore the design is such that the permanent magnet 4c supplies a magnetic field for tuning 13 GHz and the main coil 4b supplies a magnetic field (about 180 Oe) only for the remaining 500 MHz. Consequently, the current of the main coil 4b can be reduced significantly as compared with the conventional YTO which uses a YIG sphere, and accordingly the power consumption of the main coil 4b can be reduced significantly as compared with the conventional apparatus. As a result, a low-power consumption thin film YTO is provided. Owing to a smaller number of turns of the main coil 4b, the thin film YTO can be more compact. The main coil 4b has its inductance reduced in proportion to the decrease of the turns, and the speed of frequency tuning response can be improved. For example, data communications generally employ a PLL synthesizer system because of the need of a high-stability local oscillator, and the local oscillator must have a response of frequency tuning higher than the upper-limit response required for the PLL, and the above-mentioned enhancement of tuning response is advantageous in this respect.

The main coil 4b is connected with the PLL circuit 5, which is connected to the output of the thin film YTO. When channel selection is done with a channel selection circuit 6 connected to the PLL circuit 5, the oscillation output of the thin film YTO supplied to the PLL circuit 5 is lowered in frequency by a frequency divider, and is then compared with the reference frequency provided by a crystal oscillator, etc., and a control current which reflects the result of the comparison is produced by the PLL circuit 5 and it is fed back to the main coil 4b. In consequence, the current in the main coil 4b, i.e., the magnetic field H applied to the YIG thin fil resonator 2, is varied in magnitude so that the intended channel is selected.

As described, in this embodiment, a direct feedback results from the PLL circuit 5 to the main coil 4b, and the circuit arrangement for channel selection can be simplified. The direct feedback from the PLL circuit 5 to the main coil 4b is made possible due to the reduction in the number of turns of the main coil 4, as mentioned above.

As shown in FIG. 1, the provision of an FM coil 4d in addition to the main coil 4b and permanent magnet 4c, allows the FM coil 4d to be used as a frequency modulator based on the base band signal. A conceivable method is to have a direct feedback from the PLL circuit 5 to the FM coil, but in this case the circuit arrangement for channel selection becomes complex.

b. Compensation of thermal characteristics of the permanent magnet and the active element.

Since the permanent magnet 4c and the GaAs FET 1 as an active element have inherent thermal characteristics, a change in the temperature causes a variation of oscillator characteristics. This embodiment performs compensation of the thermal characteristics of the permanent magnet 4c and GaAs FET 1, as follows.

Figure 2:
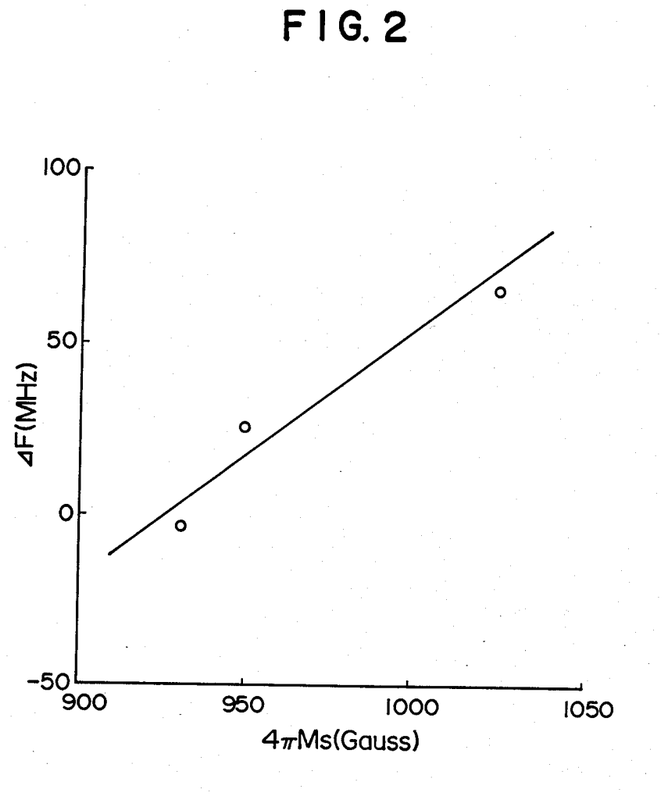
FIG. 2 is a graph showing the relation between the saturation magnetization of a YIG thin film at the room temperature corresponding to the replacement amount of Ga and the variation of resonance frequency.

As described in U.S. Pat. No. 4,745,380, part of the iron ons of the YIG are replaced with nonmagnetic ions such as gallium (Ga) ion in accordance with the thermal characteristics of the permanent magnet, and the thermal characteristics of the YIG thin film resonator 2 can be compensated up to the first order temperature coefficient. FIG. 2 shows the results of measurements of the thermal characteristics of the YIG thin film resonator, with the replacement amount of Ga being varied. In FIG. 2, the abscissa represents the saturated magnetization 4πMs of the YIG film at room temperature corresponding to the replacement amount of Ga, while the ordinate represents the difference of resonance frequencies ΔF between 60° and −30° C. FIG. 2 reveals that ΔF is virtually nullified when 4πMs is about 925 Gauss.

Figure 3:
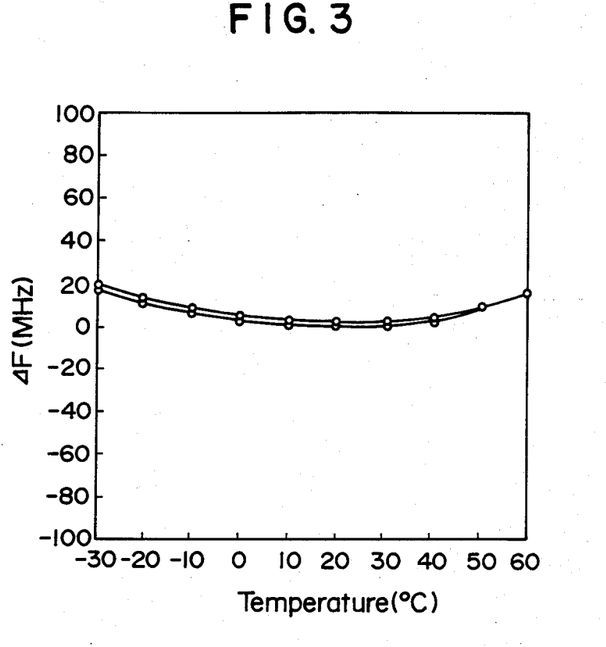
FIG. 3 is a graph showing the thermal characteristics of the YIG thin film resonator with ΔF being virtually zero in FIG. 2.
Figure 4:
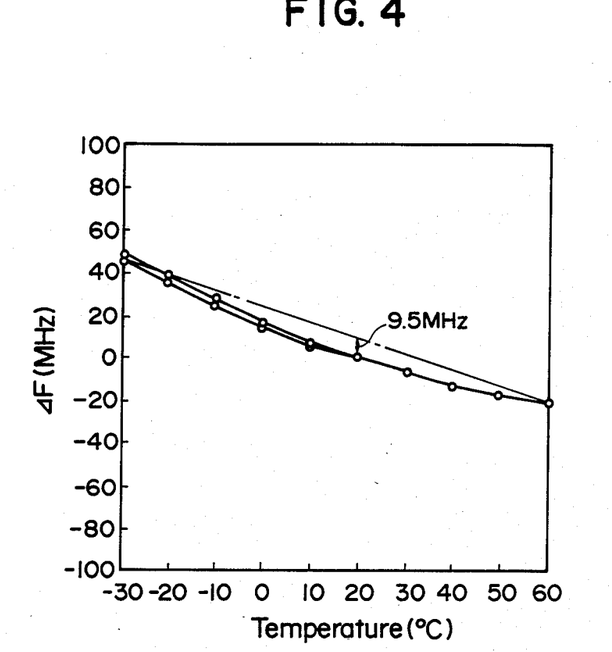
FIG. 4 is a graph showing the thermal characteristics of the thin film YTO using the YIG thin film rresonator having the thermal characteristics shown in FIG. 3.
Figure 5:
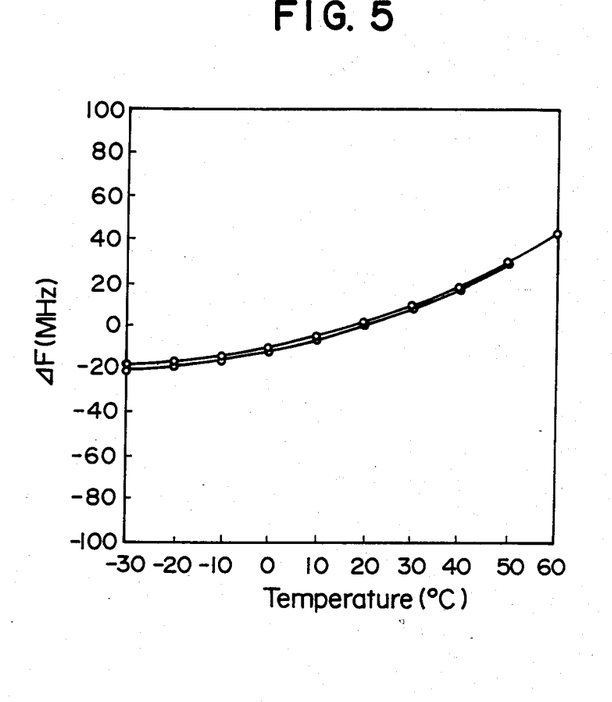
FIG. 5 is a graph showing the thermal characteristics of the YIG thin film resonator with the saturated magnetization of YIG thin film being about 1015 Gauss at room temperature through the adjustment of the replacement amount of Ga.
Figure 6:
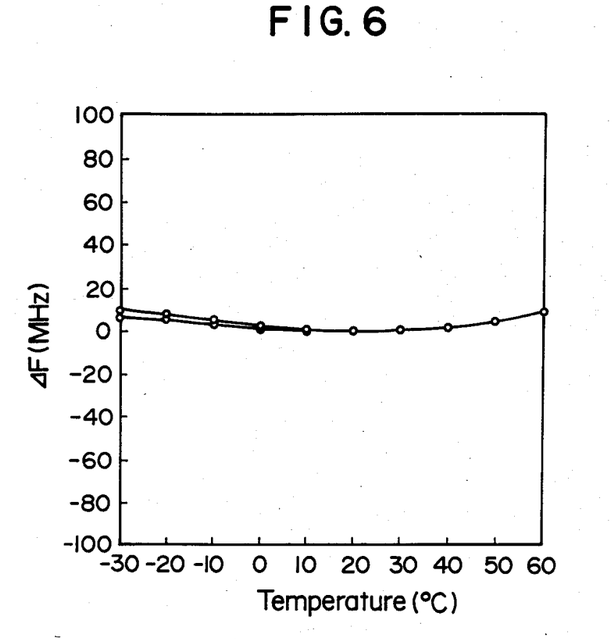
FIG. 6 is a graph showing the thermal characteristics of the thin film YTO using a YIG thin film resonator having the thermal characteristics shown in FIG. 5.

FIG. 3 shows the result of measurement of the thermal characteristics of the YIG thin film resonator having a virtually zero ΔF. FIG. 3 reveals that the first-order thermal characteristics of the YIG thin film resonator is virtually zero. Between two closely located curves in FIG. 3, the lower curve is the measurement which results in ascending temperatures, and the upper curve is the measurement which results in descending temperatures (these are also applicable to FIGS. 4, 5 an 6). FIG. 4 shows the result of measurement of the thermal characteristics of the thin film YTO using the YIG thin film resonator. As will be appreciated from FIG. 4, even at zero thermal characteristics of the YIG thin film resonator, the variation of oscillation frequency of the thin film YTO at −30° to 60° C. is −65 MHz to reflect the thermal characteristics of the GaAs FET 1 as an active element. Based on FIG. 2, the quantity of replacement of Ga is adjusted so that the saturated magnetization of the YIG thin film is about 1015 Gauss inclusive of the component attributable to the thermal characteristics of the GaAs FET 1 as an active element. As a result, the YIG thin film resonator has the thermal characteristics as shown in FIG. 5, and the thermal characteristics of the thin film YTO using the YIG thin film resonator has its first-order coefficient nullified as shown in FIG. 6. The variation of oscillation frequency due to temperature in this case can be confined to the 10 MHz bend of the thermal characteristic curve shown in FIG. 4. The compensation of the thermal characteristics component of the active element is dependent on the Q value of the YIG thin film resonator, i.e., the thermal characteristics of the resonator becomes dominant as the Q value goes higher, and the thermal characteristics of the active element contributes less to the thermal characteristics of the thin film YTO.

Although in the above explanation the thermal characteristics of thin film YTO is nullified up to the first-order coefficient through the adjustment of the amount of replcement of Ga, it is possible to nullify the thermal characteristics up to the second-order coefficient by the provision of a soft magnetic plate made of soft ferrite in the gap of the magnetic circuit, in addition to the adjustment of the Ga replacement quantity as generally shown in U.S. Pat. No. 4,746,884.

c. Microwve communication equipment using the thin film YTO for the local oscillator The microwave communication equipment has its RF stage divided briefly into an up-converter section which converts an intermediate frequency (e.g., 70 MHz or 140 MHz) signal into a microwave frequency for transmission, and a down-converter section which converts a received microwave frequency into the intermediate frequency. Since these sections have virtually symmetrical structures, the following describes only the up-converter section.

Figure 7:
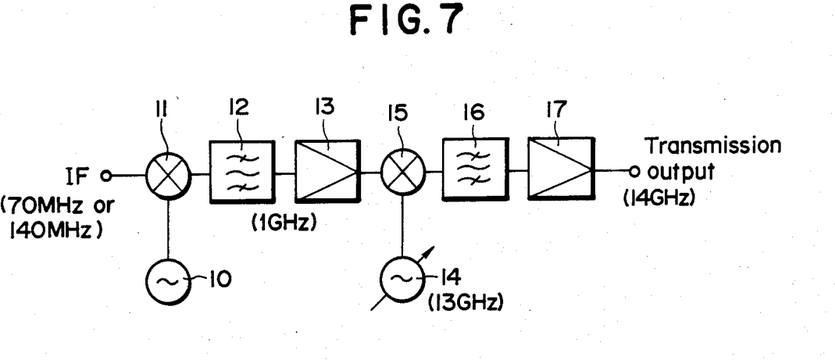
FIG. 7 is a block diagram showing the arrangement of the up-converter section of a double conversion system for a microwve transmitter using the thin film YTO shown in FIG. 1 as a local oscillator.

FIG. 7 shows the arrangement of the up-converter section of a double conversion mode of a microwave transmitter. In the microwve transmitter, the signal of the intermediate frequency (IF) is mixed by a mixer 11 with an RF signal produced by a fixed oscillator 10 to obtain a signal of 1 GHz, for example, and thereafter a signal in the desired frequency band is extracted by a band-pass filter 12. Next, the signal is amplified by an IF amplifier 13, and then mixed by a mixer 15 with a signal of 13 GHz, for example, provied by a local oscillator 14 constituted by the foregoing thin film YTO. Consequently, a signal of 13+1=14 GHz is formed. Next, the signal is fed through a band-pass filter 16, and then amplified by a high power amplifier (HPA) 17 to produce an transmission output of 14 GHz.

According to the microwave transmitter shown in FIG. 7, the IF signal is once converted into a high frequency of around 1 GHz, for example, and it is advantageous in prevent spurious waves from falling at a high level into the communication band. The local oscillator 14 formed by the thin film YTO using the YIG thin film resonator 2 of high Q value enables low BER for data communication and large S/N, to obtain high-quality communication for image communication. Moreover, the ability of signal selection in the RF stage simplifies the structure of IF stage.

Figure 8:
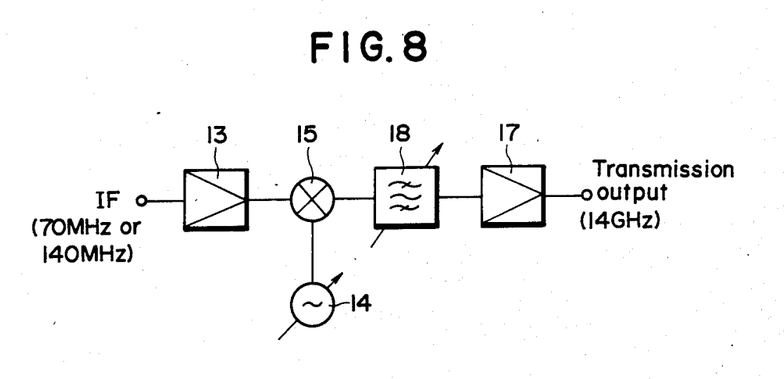
FIG. 8 is a block diagram showing the arrangement of the up-converter section of single conversion system for a microwave transmitter using the thin film YTO shown in FIG. 1 as a local oscillator.

Next, FIG. 8 shows the arrangement of the up-converter for single conversion mode. In the microwave transmitter, the IF signal is amplified by an IF amplifier 13 and thereafter mixed by a mixer 15 with the oscillation output of a local oscillator 14 which is constituted by the thin film YTO so that it is frequency converted to a signal of 14 GHz. Next, the signal is fed through a YIG thin film tuning filter (thin film YTF) 18 such as described in U.S. Pat. No. 4,626,800 so that a signal in the desired frequency band is extracted, and thereafter the signal is amplified by a high power amplifier 17 to produce a transmission output of 14 GHz.

According to the microwave transmitter shown in FIG. 8, high-quality communication takes place, as in the transmitter shown in FIG. 7, and at the same time the IF stage can be simplified. The use of single conversion mode is advantageous due to the simplicity of the structure as compared with the transmitter shown in FIG. 7. Furthermore, the YIG thin film tuning filter 18 is a tracking filter having a sharp response curve, and therefore it prevents spurious wves, such as the oscillation output of the thin film YTO and the image signal, from falling at a high level into the communiation band. By separating the thin film YTO and the YIG thin film tuning filter by an offset frequency equal to IF, they can be built in the gap of the same magnetic circuit as shown in U.S. Pat. No. 4,704,739. In this case, the control current produced by the PLL is fed back to the common magnetic circuit, and therefore the tracking error can be eliminated in principle.

Although only the up-converter section of the microwave transmitter using the film YTO as a local oscillator has been described, the up-converter and down-converter sections can share a local oscillator by choosing the tuning frequency of thin film YTO between the transmission band and reception band. This example will be described in the following.

d. Microwave transceiver for satellite communication

Figure 9:
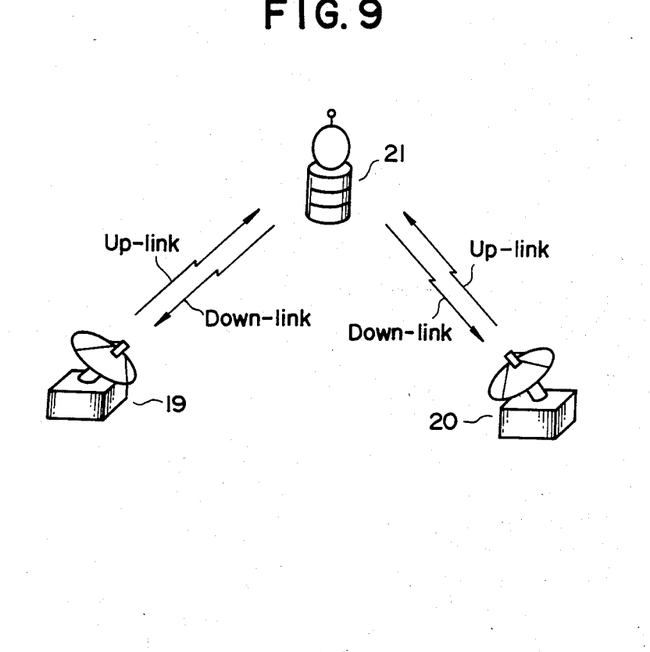
FIG. 9 is a diagram showing the fundamental organization of a satellite communication system.

As show in FIG. 9, the satellite communication is a microwave linkage between ground stations 19 and 20 by way of a satellite (space station) 21. The communication lines connecting the ground stations 19 and 20 necessitate a link from ground station 19 to satellite 21 to ground station 20 and another link from ground station 20 to satellite 21 to ground station 19. A communication path from a ground station to a satellite is called an "up-link", while a communication path from the satellite to a ground station is called a "down-link". Generally, different frequencies are used for the up-link and down-link. For example, in satellite communication of "C-band", 6 GHz and 4 GHz are alloted to the up-link and down-link respectively, and in satellite communication of "Ku band", 14 GHz and 12 GHz are alloted to the up-link and down-link respectively.

The ground stations 19 and 20 shown in FIG. 9 have transceiver RF units each consisting of an up-converter section for converting IF to the up-link microwave frequency and a down-converter section for converting the down-link microwve frequency to IF. By choosing the oscillation frequency of the thin film YTO to be between the up-link frequency band and down-link frequency band, the up-converter and down-converter can share a local oscillator formed by the thin film YTO.

Figure 10:
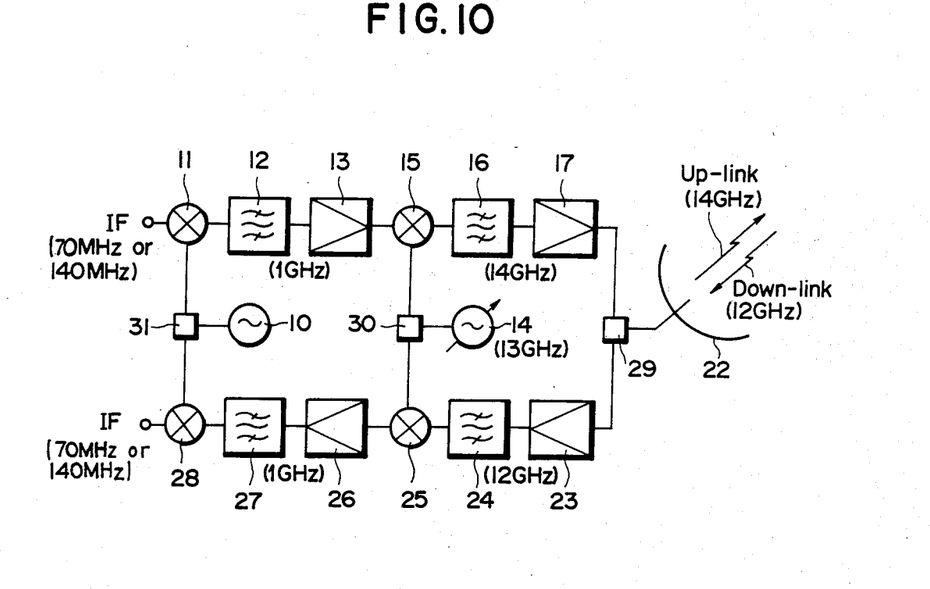
FIG. 10 is a block diagram showing an example of the transceiver RF unit for a double conversion mode for a microwave transceiver using the thin film YTO as a local oscillator.

FIG. 10 shows an example of the transceiver RF unit of the double conversion mode for a microwave transceiver using the thin film YTO for the local oscillator. As shown in FIG. 10, the IF is converted to 1 GHz by the mixer 11 and is further mixed by the mixer 15 with a 13 GHz signal provided by the local oscillator 14 so that it becomes a 14 GHz signal, as mentioned previously, and after being filtered in filter 16 and amplified by a high power amplifier 17, it is transmitted as a 14 GHz microwave with a parabolic antenna 22. On the reception side, a microwave signal of 12 GHz, for example, is received by the parabolic antenna 22 and is amplified by a low noise amplifier (LNA) 23 and, after a signal in the wanted frequency band has been extracted by a band-pass filter 24, it is mixed with a 13 GHz signal provided by the local oscillator 14 and converted to a 1 GHz signal. The 1 GHz signal is amplified by an IF amplifier 26, and, after being fed through a band-pass filter 27, it is mixed by a mixer 28 with a signal provided by the fixed oscillator 10 and an IF signal is produced. Switching of between transmission and reception is implemented by a duplexer 29. Selection as to whether the oscillation output of the local oscillator 14 is to be delivered to the mixer on the transmission side or the mixer 25 on the reception side is implemented by a hybrid circuit 30, and selection as to whether the oscillation output of the fixed oscillator is to be delivered to the mixer 11 on the transmission side or to the mixer 28 on the reception side is implemented by a hybrid circuit 31.

Since the local oscillator 14 and fixed oscillator 10 are shared by the up-converter and down-converter, the microwave transceiver can be simplified. Features including high quality communication and the simplicity of the IF stage are identical to the transmitter shown in FIGS. 7 and 8.

Although specific embodiments of this invention have been described, the invention is not confined to the foregoing embodiments, but various modifications are possible within the technical concept of this invention.

For example, in a microwave transceiver, the up-converter and down-converter are arranged in single conversion mode and double conversion mode, respectively, with the local oscillator of thin film YTO being shared by the up-converter and down-converter, or vice verse. Furthermore, also in the ground microwave communication, it is possible to configure a transceiver using a local oscillator of thin film YTO, as in satellite communication.

According to this invention, the d.c. magnetic field application means is made up of a permanent magnet for producing a fixed magnetic field component and a coil for producing a variable magnetic field component, and the coil can have its number of turns reduced to the extent equivalent to the fixed magnetic field produced by the permanent magnet, and accordingly the inductance of the coil can be reduced by that amount. Consequently, the response speed of frequency tuning can be enhanced. The turning oscillator can be made smaller to the extent of reduction in the number of turns of the coil. Furthermore, the coil current can be reduced by the amount equivalent to the fixed magnetic field produced by the permanent magnet, whereby a tuning oscillator of low power consumption can be produced. Because of ease of manufacturing the ferrimagnetic thin film resonator, the tuning oscillator is suitable for large scale production and it is also inexpensive. Because of the feedback to the coil is based on a PLL, the circuit arrangement for channel selection can be simplified.

Further the local oscillator for converting the IF to a transmission frequency is formed of a YIG thin film tuning oscillator, which enables the signal selection in the RF stage, and consequently the IF stage can be simplified. The YIG thin film tuning oscillator uses a YIG thin film resonator with a high Q value, and therefore the phase noise is low and accordingly high quality communication is assured.

We claim as our invention:

1. A tuned oscillator utilizing a thin film ferromagnetic resonator comprising;
    an active element for oscillation,
    a thin film ferromagnetic resonance element formed of a thin film ferromagnetic plate and a transmission line coupled to said thin film ferromagnetic plate and connected to said active element as a part of a feed back circuit for said active element,
    bias magnetic field means applying a bias magnetic field perpendicular to said thin film ferromagnetic plate, and
    a PLL (phase lock loop) circuit receiving an oscillation output and generating a control signal to stabilize the oscillation,
    said bias magnetic field means being formed of a permanent magnet which generates a fixed bias magnetic field component and a coil which generates a variable bias magnetic field component, said coil being fed with a current which is controlled by said control signal which is obtained from said PLL circuit.

2. A tuned oscillator according to claim 1, wherein said tuned oscillator oscillates between a lowest and highest frequencies, said permanent magnet generates said fixed bias magnetic field component to cause ferromagnetic resonance in said ferromagnetic plate at said lowest frequency, and said oil generates said variable bias magnetic field component to cause ferromagnetic resonance in said ferromagnetic plate at a frequency between said lowest and highest frequencies.

3. A tuned oscillator according to claim 1, wherein said thin film ferromagnetic plate is formed of YIG (yttrium iron garnet).

4. A tuned oscillator according to claim 3, wherein said thin film ferromagnetic plate is formed of YIG, in which a part of the Fe ions are substituted with nonmagnetic ions to reduce the saturation magnetization of the YIG to compensate the temperature characteristics of said permanent magnet, YIG thin film resonator and said active element.

* * * * *